United States Patent [19]

Eberle et al.

[11] Patent Number: 5,189,634

[45] Date of Patent: Feb. 23, 1993

[54] DIGITAL SIGNAL PROCESSING APPARATUS FOR DETECTING A FREQUENCY COMPONENT OF DIGITAL SIGNALS

[75] Inventors: Gernot Eberle, Lanark; Guy J. Chaput, Carleton Place, both of Canada

[73] Assignee: Northern Telecom Limited, Montreal, Canada

[21] Appl. No.: 676,593

[22] Filed: Mar. 28, 1991

[51] Int. Cl.⁵ ............................................. G06F 15/31
[52] U.S. Cl. .......................... 364/724.09; 364/724.17
[58] Field of Search ................... 364/724.01, 724.08, 364/724.09, 724.17, 274.19; 370/110.3

[56] References Cited

U.S. PATENT DOCUMENTS

| | | | |
|---|---|---|---|
| 3,777,130 | 12/1973 | Croisier et al. | 364/724.17 X |
| 4,305,133 | 12/1981 | Amada et al. | 364/724.17 X |
| 4,354,248 | 10/1982 | Conger et al. | 364/724 |
| 4,450,533 | 5/1984 | Petit et al. | 364/724 |
| 4,797,846 | 1/1989 | Benkara et al. | 364/724.17 |
| 4,928,258 | 5/1990 | May | 364/724.17 |

OTHER PUBLICATIONS

IEEE Transactions on Acoustics, Speech and Signal Processing, vol. ASSP-22, No. 6, Dec. 1974, entitled "A New Hardware Realization of Digital Filters", by A. Peled and B. Liu, pp. 456-462.

Primary Examiner—Jerry Smith
Assistant Examiner—C. Ngo
Attorney, Agent, or Firm—Yoshiharu Toyooka

[57] ABSTRACT

A digital signal processing apparatus is disclosed. The apparatus is particularly suited for detecting a digital signal containing a frequency component in a noisy environment. It uses a distributed arithmetic concept for hardware realization. The use of specific coefficients and hardware arrangement has resulted in a reduction of memory location requirement. The invention finds the main application in the area of telephony in which detection of a variety of signal tones is required for various operations of telephone functions.

7 Claims, 6 Drawing Sheets

DIGITAL SIGNAL PROCESSING APPARATUS FOR DETECTING A FREQUENCY COMPONENT OF DIGITAL SIGNALS

FIELD OF THE INVENTION

This invention relates to a digital signal processing technique of signals which are binary coded in the fractional two's complement. More particularly, it is directed to a digital signal processing apparatus for detecting a selected frequency component in a pulse coded digital signal.

BACKGROUND OF THE INVENTION

It is well known that signal detectors which operate digitally are generally built around the basic digital apparatus called digital filter. Tone signal detectors used in telephony are a good example. Such a filter is designed to function as a band-pass, low-pass or high-pass filter etc. to pass or to block a signal containing a desired frequency component. For example, in digital telephony there are vast areas where detecting a specific tone signal is required for performing a variety of telephone operations. Various kinds of digital filters have been used for these purposes. U.S. Pat. No. 4,354,248, issued Oct. 12, 1982 to Conger et al, describes a programmable multi-frequency tone receiver using such a digital filter technique. The tone receiver uses a time multiplexed digital filter consisting of three cascaded second order filters under control of a sequence controller. It is very complex and requires a large amount of memory capacity. U.S. Pat. No. 3,777,130, issued Dec. 4, 1973 to Croisier et al, teaches a general purpose digital filter for PCM encoded signals. It describes a novel way of implementing into hardware a digital filter for binary coded signals. It takes advantage of the use of modified two's complement numeric representation and results in a significant saving of the memory spaces in the storage device. U.S. Pat. No. 4,797,846, issued Jan. 10, 1989 to Benkara et al, is directed to a digital filter apparatus with resonance characteristics. This patent discloses a straightforward scheme of implementation which needs less hardware. It teaches specifically selected values of coefficient factors which simplify hardware implementation. U.S. Pat. No. 4,450,533, issued May 22, 1984 to Petit et al, discloses digital processing apparatus which is hardware implemented according to the distributed arithmetic concept. A detailed discussion on the distributed arithmetic concept used for the hardware realization of digital filters is found in *IEEE Trans. on Acoustics, Speech, and Signal Processing*, Vol. ASSP-22, No. 6, December 1974, entitled "A New Hardware Realization of Digital Filters", by A. Peled and B. Liu. The present invention further reduces the hardware requirement for digital signal processing apparatus using this concept.

OBJECTS OF THE INVENTION

It is therefore an object of the invention to provide a digital signal processing apparatus which uses the distributed arithmetic concept.

It is a further object of the invention to provide a digital signal processing apparatus for detecting a desired frequency component in a digital signal.

It is still an object of the invention to provide a digital signal processing apparatus for detecting a desired frequency component in a digital signal which requires minimum hardware.

It is yet another object of the invention to provide a digital signal processing apparatus for detecting a desired frequency component in a digital signal which is very sensitive in a noisy environment.

SUMMARY OF THE INVENTION

Briefly stated, the present invention is directed to a distributed arithmetic digital signal processing apparatus for detecting a frequency component $F_r$ in pulse coded digital signal expressed in the fractional two's complement. The apparatus comprises storage means which hold three stored values which are $A_0/4$, $B_1/4 = 2\{\cos(2\pi F_r/F_s)\}/4$, and $(A_0 + B_1)/4$; where $A_0$ is a real number and $F_s$ is a sampling frequency. The storage means further include two address terminals and a data output terminal for producing a content signal in response to the state of the two address terminals. The apparatus includes first shift register means for receiving the input signal and sending each sample of the input signal to one of the address terminals, and second shift register means connected to the other of the address terminals for shifting a register input by one sample and sending its register output to the other of the address terminals. Subtracting means is connected to the data output terminal for subtracting $\frac{1}{4}$ from the content signal. An accumulator stage is connected to the subtracting means for applying back the accumulator output to the second shift register means as its register input. Third shift register means is connected to the second shift register means for shifting the output of the second shift register means by one sample and sending its output to the subtracting means. The apparatus further has maximum register means connected to the accumulator stage to register the maximum value of the accumulator output in every sampling session containing a predetermined number of samples and to generate a detector output signal indicative of the maximum value.

BRIEF DESCRIPTION OF THE DRAWINGS

For a more complete understanding of the present invention and for further objects and advantages thereof, reference may now be made to the following description, taken in conjunction with the accompanying drawings, in which.

DETAILED DESCRIPTION OF THE PREFERRED EMBODIMENTS

Figure 1:
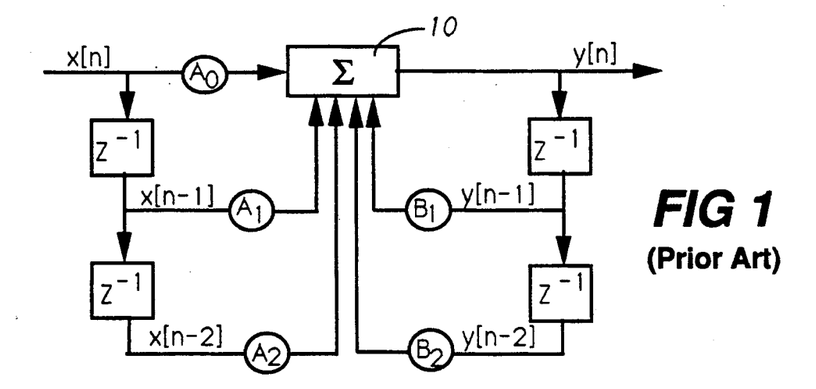
FIG. 1 is a block diagram of a second order digital signal processing apparatus of the prior art.

FIG. 1 represents, in a general way, a second order digital signal processing apparatus. Such an apparatus receives, at a sampling frequency $F_s$, successive binary digital input samples $x[n]$, and provides successive binary digital output samples $y[n]$. The derivation of an output sample $y[n]$ from an input sample $x[n]$ requires knowledge of previous input samples $x[n-1]$ and $x[n-2]$ as well as previous output samples $y[n-1]$ and $y[n-2]$. The input sample $x[n-1]$ is that which has immediately preceded the input sample $x[n]$ at the sampling frequency; similarly for $x[n-2]$ with respect to $x[n-1]$, for $y[n-1]$ with respect to $y[n]$ and for $y[n-2]$ with respect to $y[n-1]$. The input samples $x[n]$, $x[n-1]$ and $x[n-2]$ are multiplied by the first, second and third coefficients $A_0$, $A_1$, and $A_2$ respectively; the output samples $y[n-1]$ and $y[n-2]$ are multiplied by the fourth and fifth coefficients $B_1$ and $B_2$ respectively of opposite sign and the output sample $y[n]$ is obtained by algebraic summation of the products by summing means 10. These coefficients are deduced in accordance with the selected method, either from the pulse response or from the desired frequency transfer function. Various delay lines composed of delay cells $Z^{-1}$ with unit delay, equal to the sampling period, are provided to generate signals $x[n-1]$, $x[n-2]$, $y[n-1]$ and $y[n-2]$. The transfer function of such a signal processing apparatus conventionally designated $H(Z)$, is given by the expression:

$$H(Z) = (A_0 + A_1 Z^{-1} + A_2 Z^{-2})/(1 - B_1 Z^{-1} - B_2 Z^{-2})$$

where $Z^{-1}$ represents a unit delay corresponding to one cycle of a signal at the sampling frequency, that is, to a delay such as that between the samples $x[n-1]$ and $x[n]$.

In the customary representation in the real number axis R and the purely imaginary number axis I, the transfer function $H(Z)$ is characterized by two zeros and two poles. The zeros are solutions to the equation:

$$A_0 + A_1 Z^{-1} + A_2 Z^{-2} = 0$$

and the poles are solutions to the equation:

$$1 - B_1 Z^{-1} - B_2 Z^{-2} = 0$$

It is customary also that the portion of the apparatus containing delay cells and transfer coefficients $A_1$ and $A_2$ is called the "direct section" and renders the apparatus as a finite impulse response (FIR) circuit. The remaining portion is the "feedback section". Thus without the direct section, the apparatus functions as an infinite impulse response (IIR) circuit. It is also well known in the art that the transfer coefficient $B_2$ determines whether the apparatus operates as a filter ($B_2 > -1.0$), a resonator ($B_2 = -1$) or an oscillator ($B_2 < -1$).

Thus such a device involves multiplying and adding operations and it seems to be particularly interesting to carry out these operations by using personalized computers after conversion of the samples to be filtered in digital mode. In this case each sample supplies a logic word, the bits of which after passing through the various levels of a shift register providing pure delays, processed in order to carry out the mathematical operations indicated above. In fact, the signal has often been already converted in digital mode, through modulation processes.

There have been many patents which are concerned with various circuit implementations of this digital signal processing apparatus. The aforementioned U.S. Pat. Nos. 3,777,130, issued Dec. 4, 1973 (Croisier et al), and 4,797,846, issued Jan. 10, 1989 (Benkara et al), are only some of the exemplary ones.

For example, a filter for PCM with M bit words may be synthesized by using a shifting register the respective stages of which contain M bit positions. The outputs of every stage are applied to a ROM address decoder. The memory supplies the contribution of the affected bits at its output. To take into account the weights of the various binary bits, it is possible to use an accumulator composed of a binary adder followed by a shifting register and provided with a feedback loop.

Figure 2:
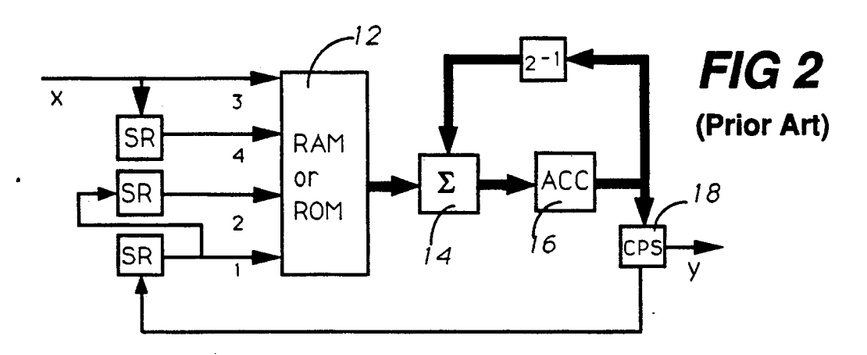
FIGS. 2 and 3 are block diagrams of the prior art digital filters.

As one exemplary embodiment, the PCM filtering device described above is shown in FIG. 2. A ROM or a RAM 12 addressed by four bits and therefore containing $2^4 = 16$ words (contents) corresponding to all the possible combinations of four coefficient values constitutes the central element of the filter. The ROM or RAM 12 receives at its input the bits affected with the proper weight and selects a memory position supplying the result in parallel on its output. The N bits coming from the ROM or RAM are transmitted to a summing means 14 and an accumulator (ACC) 16. The N bits coming from the accumulator and containing the output information $y[n]$ are applied back to the summing means through a stage carrying out a division by two, or a shift to the right. After rounding off to M-bits, the output of the accumulator is serialized through a serializer (CPS) 18 before being fed back to a shift register (SR) representing a unit delay $Z^{-1}$.

Figure 3:
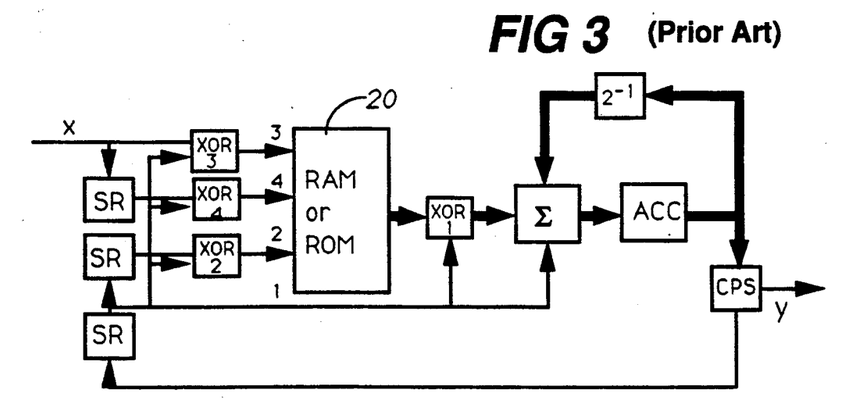

U.S. Pat. No. 3,777,130 and the article by Peled et al, both referred to above, describe a further simplified implementation scheme by using a modified two's complement numeric representation. In this modified representation, all the M two's complement bits are reproduced without modification except for the "1" of the highest order $Z_M$, which is complemented. The weights of these M bits are then reduced by one. Therefore the words coded in this representation have one bit more than the ones written in two's complement code. FIG. 3 illustrates diagrammatically one such way of hardware realization, using this numeric representation. This scheme takes into consideration that the extra bit can be used as an index bit, resulting in halving the required storage capacity. In the figure, the bits $Z_{2j}$, $Z_{3j}$ and $Z_{4j}$, before being used to address the storage 20, go through circuits XOR2, XOR3 and XOR4 respectively, the second output of which is supplied by index $Z_{1j}$, which complements them when this last bit is a binary "1". In addition, the sign of the word written in two's complement using N bits, fetched out from the storage should also be modified if $Z_{1j} = 1$ since the storage contains only one half of the partial coefficient value contributions. For this purpose, said N bits and the index are submitted to a XOR logic operation by using XOR1 circuit, then a binary "1" is added to the result through the summing means and the accumulator. In this device the storage requires only eight locations instead of sixteen as in the earlier case.

Figure 4:
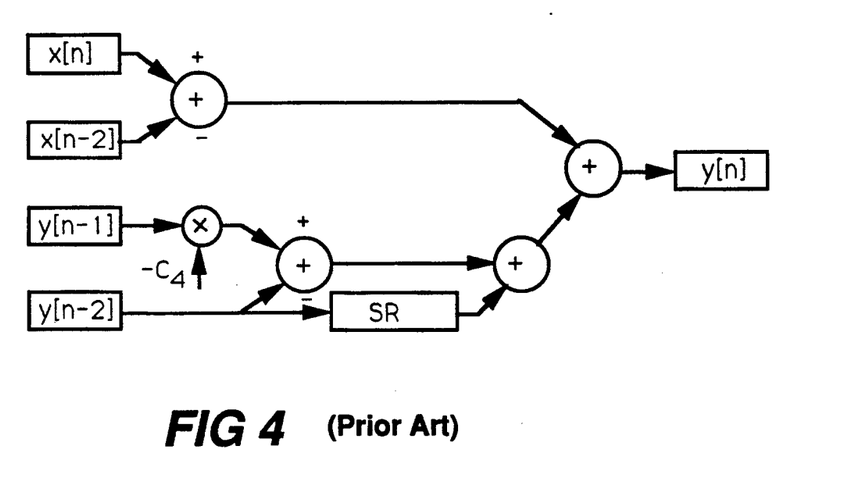
FIG. 4 is a block diagram of another prior art digital filter.

U.S. Pat. No. 4,797,846 describes another embodiment of a digital signal processing apparatus in which a simple implementation is realized in cases where coefficients are specific values, e.g. $A_0 = 1$, $A_1 = 0$, $A_2 = -1$, $B_1 = -2R \cos(2\pi F_r/F_s)$ and $B_2 = 1-2k$ ($k \geq 4$). $F_s$ is the sampling frequency and $F_r$ is the desired resonant frequency. In this case, the implementation is shown in FIG. 4 and the apparatus functions as a resonant digital filter, i.e. a bandpass filter with a resonant frequency $F_r$ as a center frequency of the pass-band and R in relation to the unity determines the selectivity. It consists of a single multiplication, four additions and a shift (SR), together with other unit delay elements.

The present invention deals with the above general concept of the (IIR) digital signal processing apparatus and it is particularly directed to the case where $B_1 = 2 \cos(2\pi F_r/F_s)$ and $B_2 = -1$.

Figure 5:
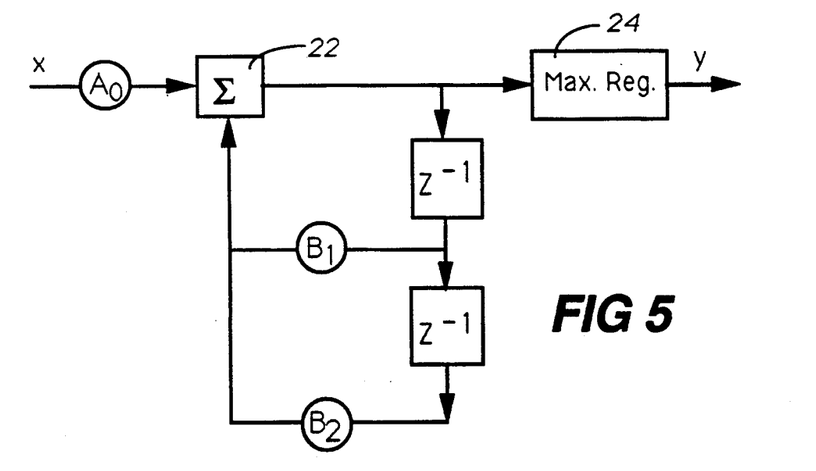
FIG. 5 is a general block diagram of the digital signal processing apparatus according to the present invention.

FIG. 5 therefore illustrates schematically such an apparatus which includes unit delays $Z^{-1}$ and a summing means 22 and a maximum register 24 whose functions will be described later.

The transfer equation is represented as follows:

$$y[n] = A_0 x[n] + B_1 y[n-1] + B_2 y[n-2] \quad (1)$$

Figure 6:
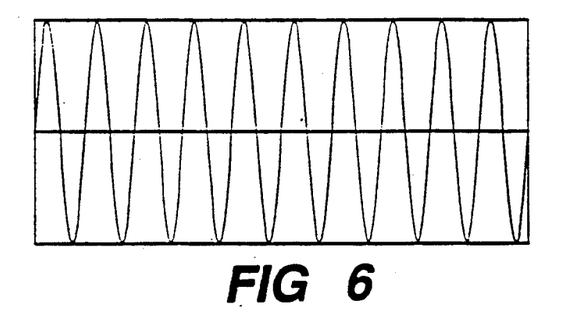
FIGS. 6–8 are graphs showing the amplitude of the output with respect to time.
Figure 7:
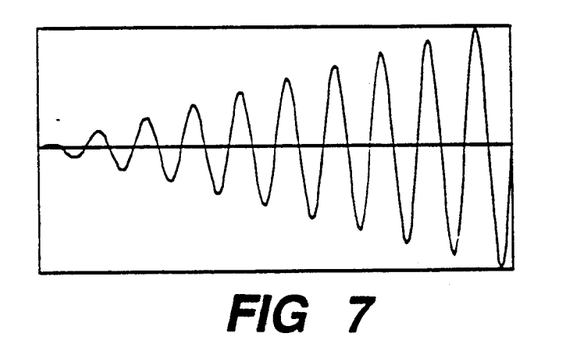
Figure 8:
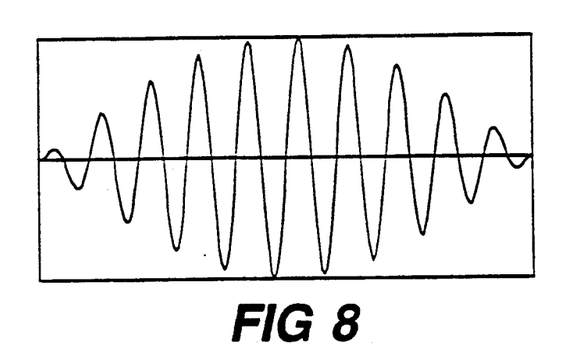

The invention deals with specific implementations of this general form of the digital signal processing apparatus which, due to the use of the specific numeric representation and the resonator coefficients, require very minimum hardware, thus economizing the cost of manufacture. The apparatus shown has a resonance frequency of $F_r$. If the input signal "x" contains a frequency component $F_r$ at a sufficient amplitude, the resonator will oscillate with increasing amplitude. This is shown in FIGS. 6 and 7. FIG. 6 shows the input signal "x" while FIG. 7 shows the output signal "y" of the resonator. The output signal "y" will constantly increase until the numerical limit is reached. Therefore the required numerical scope (number of bits used in the numerical representation) is affected by the observation time and sampling frequency. In FIG. 8 the frequency of the input signal "x" does not match the resonance frequency of the resonator. The amplitude of the output signal "y" will periodically increase and decrease. The maximum amplitude will always be less than in FIG. 6.

In accordance with the known teaching, e.g. the above-referenced U.S. Pat. No. 3,777,130, a minimum of eight storage locations is required to perform the second order digital filter operation. However by choosing the basic configuration shown in FIG. 5 and a specific numeric representation to be discussed below, the inventors have been able to reduce the hardware requirement still further.

The numeric representation selected is the fractional two's complement representation which provides a form of:

$$x = -x_0 + \sum_{i=1}^{i=b} x_i * 2^{-i} \quad (2)$$

where b is the number of bits in a sample. Inserting the fractional two's complement numeric representation into equation (1) yields the following realization, bearing in mind $B_2 = -1$, $$y[n] = \{-x[n]_0 + \Sigma(x[n]_i * 2^{-i})\} * A_0 + \\ \{-y[n-1]_0 + \Sigma(y[n-1]_i * 2^{-i})\} * B_1 - \\ \{-y[n-2]_0 + \Sigma(y[n-2]_i * 2^{-i})\} \quad (3)$$

A rearrangement results in the following:

$$y[n] = -\{x[n]_0 * A_0 + y[n-1]_0 * B_1 - y[n-2]_0\} + \\ \Sigma\{x[n]_i * A_0 + y[n-1]_i * B_1 - y[n-2]_i\} * 2^{-i} \quad (4)$$

As seen in the above equation, all three multiplications can be performed simultaneously and distributed over the sample bits.

| y[n−2]$_i$ | y[n−1]$_i$ | x[n]$_i$ | $B_2 = -1$ | (+) | $B_1$ | (+) | $A_0$ | M |
|---|---|---|---|---|---|---|---|---|
| 0 | 0 | 0 | 0 | | 0 | | 0 | 0 |
| 0 | 0 | 1 | 0 | | 0 | | $A_0$ | $A_0$ |
| 0 | 1 | 0 | 0 | | $B_1$ | | 0 | $B_1$ |
| 0 | 1 | 1 | 0 | | $B_1$ | | $A_0$ | $A_0 + B_1$ |
| 1 | 0 | 0 | −1 | | 0 | | 0 | −1 |
| 1 | 0 | 1 | −1 | | 0 | | $A_0$ | $-1 + A_0$ |
| 1 | 1 | 0 | −1 | | $B_1$ | | 0 | $1 + B_1$ |
| 1 | 1 | 1 | −1 | | $B_1$ | | $A_0$ | $-1 + A_0 + B_1$ |

$M = x[n]_i * A_0 + y[n-1]_i * B_1 + y[n-2]_i$

It is clear from the above table that there are only eight possible values for M, but a further reduction in the number of possible values can be obviously seen because the last four rows are repeat of the first four rows with exception of $B_2$ which is either 0 or −1. This last calculation can be carried out by subtracting 1 (or adding −1) and requires very minimum hardware. In practice, because a number in the fractional two's complement must be within −1 and 1, that is to say $-1 \leq x < 1$, ¼ is subtracted (or −¼ is added) instead of 1 as discussed above. Therefore if a memory (storage device) is provided to store values $A_4$, $B_4$ and $(A_0+B_4)$, the calculation needed to generate y[n], according to equation (4) above, would be simple addition or subtraction (negative addition) in addition to $2^{-1}$ operation. As will be described later, the $2^{-i}$ operation can be implemented by consecutive passages through a simple hardware connection of $2^{-1}$ because of the use of the fractional two's complement representation. No multiplication would be needed. Multiplication requires more complicated hardware.

Figure 9:
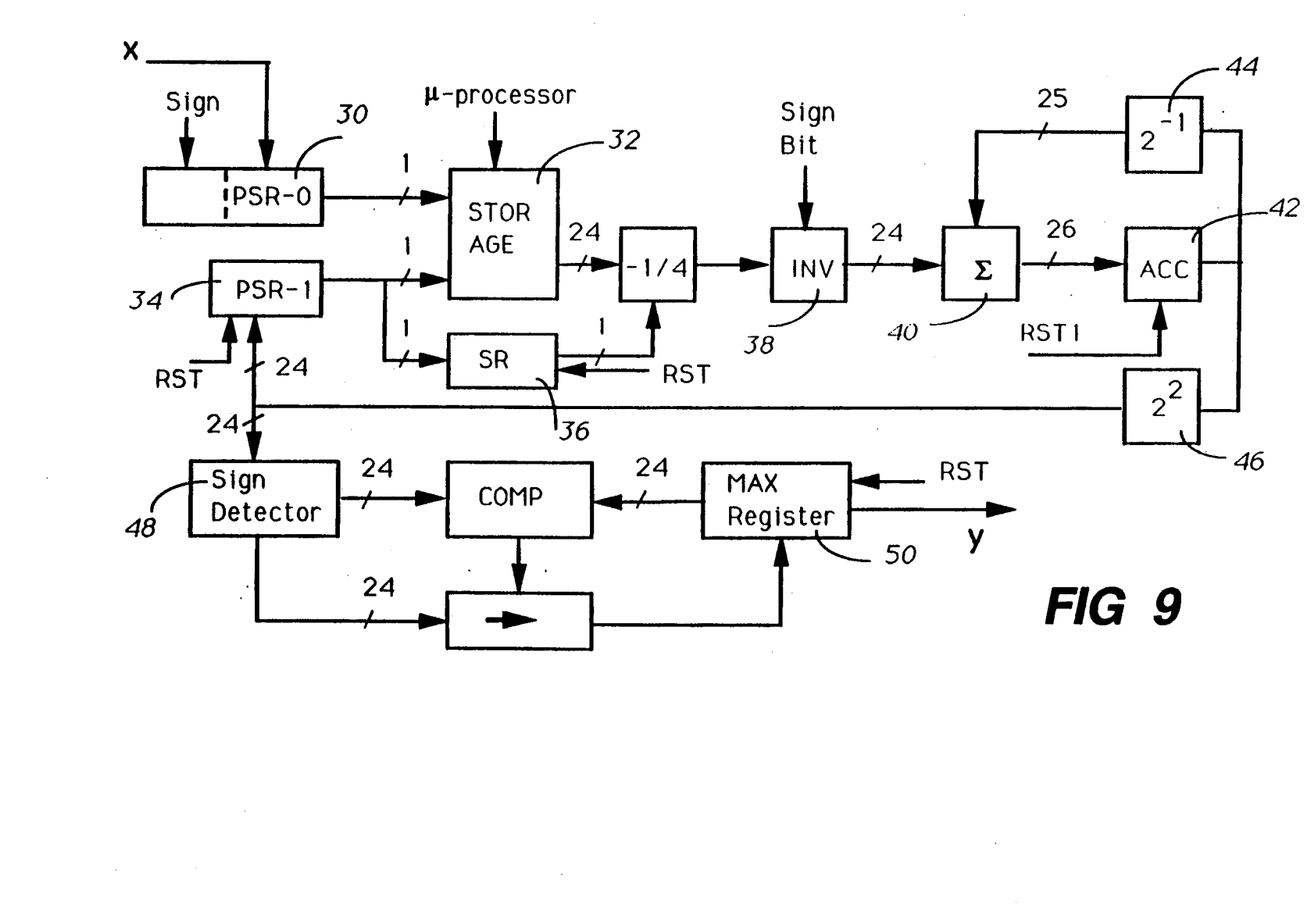
FIG. 9 is a block diagram of the digital signal processing apparatus according to a preferred embodiment of the present invention.

FIG. 9 illustrates schematically one way of realizing the above concept in hardware. As an example, the preferred embodiment shown in FIG. 9 is designed for an application in telephony. It should be noted that with some modifications the invention can be adapted for other areas of application without departing from the spirit of the invention. In FIG. 9, a 12 bit binary coded sample "x" is parallel latched into a parallel register (PSR-0) 30 at a frequency of 6800 Hz which sends in every sample a serial signal x[n] made up of 12 bits to one of the address terminals of the storage means 32. The upper 12 bits are leaded with the sign bit (all twelve bits are either loaded with zeros or ones). The storage means 32 holds stored values of $A_0/4$, $B_1/4 = 2\{\cos(2\pi F_r/F_s)\}/4$ and $(A_0+B_1)/4$. The storage means can be a ROM permanently holding these values or a RAM whose stored values are variable under the control of a microprocessor. Alternatively, it can be a set of registers which hold the specific values. Meanwhile the output of one previous sample y[n−1] is fed to another parallel shift register (PSR−1) 34 which sends its output to another of the address terminals of the storage means which produces at its data terminal the output $A_0/4$, $B_1/4$ or $(A_0+B_1)/4$ in response to the states of the two addresses. Further if both input terminals are "0", "0" is presented on the output terminal. The output of (PSR−1) 34 is sent also to a shift register (SR) 36 which produces a serial output representing y[n−2], y[n−2] being either 0 or −1. If the serial output of register SR 36 is 1, −¼ is added to the output of the storage means selected by the outputs of shift registers (PSR−0) 30 and (PSR−1) 34. This result is inverted by an invertor 38 for the last bit only. The output of the invertor is added by way of a summing device 40 to an accumulator (ACC) 42 coupled with $2^{-1}$ shifting connections 44 which are simply hardware connections for one position wired down ($\times \frac{1}{2}$). The accumulator (ACC) 42 and the $2^{-1}$ shifting connections 44 perform a proper weighting operation so that a properly binary coded output signal is produced. The result is written into the accumulator (ACC) 42. The output of the accumulator (ACC) 42 is multiplied by, 4 by $2^2$ shifting connections 46 which, like the $2^{-1}$ shifting connections 44 above, are simply hardware connections for two positions ($\times 4$) wired up, and is then written to the shift register (PSR−1) 34. This closes the loop. A sign detector 48 ensures the digital signal to be positive and a maximum register 50 stores the current maximum value of the accumulator output after comparing the current signal with previously stored maximum value of the maximum register 50. The detector output y indicates always the value in the maximum register 50. This result can be read by the microprocessor. Resetting terminals RST or RST1 are provided for resetting either at the beginning of each sampling session or at the beginning of each sample.

As mentioned above, the whole operation of the digital apparatus is reset after each successive sampling session, each containing a predetermined number of samples. The number of samples in a sampling session determines the signal/noise ratio (window width). The larger the sampling session and therefore the longer the observation period, the higher the signal/noise ratio. In other words, the window width continuously decreases with an increase of the observation period, (window width is proportional to 1/{observation period}). The observation period is adjustable, that is to say, the number of the samples in a sampling session can be altered by changing the period of resetting of the resetting means. In this way, the signal/noise ratio can be readily adjusted for various environments.

Figure 10:
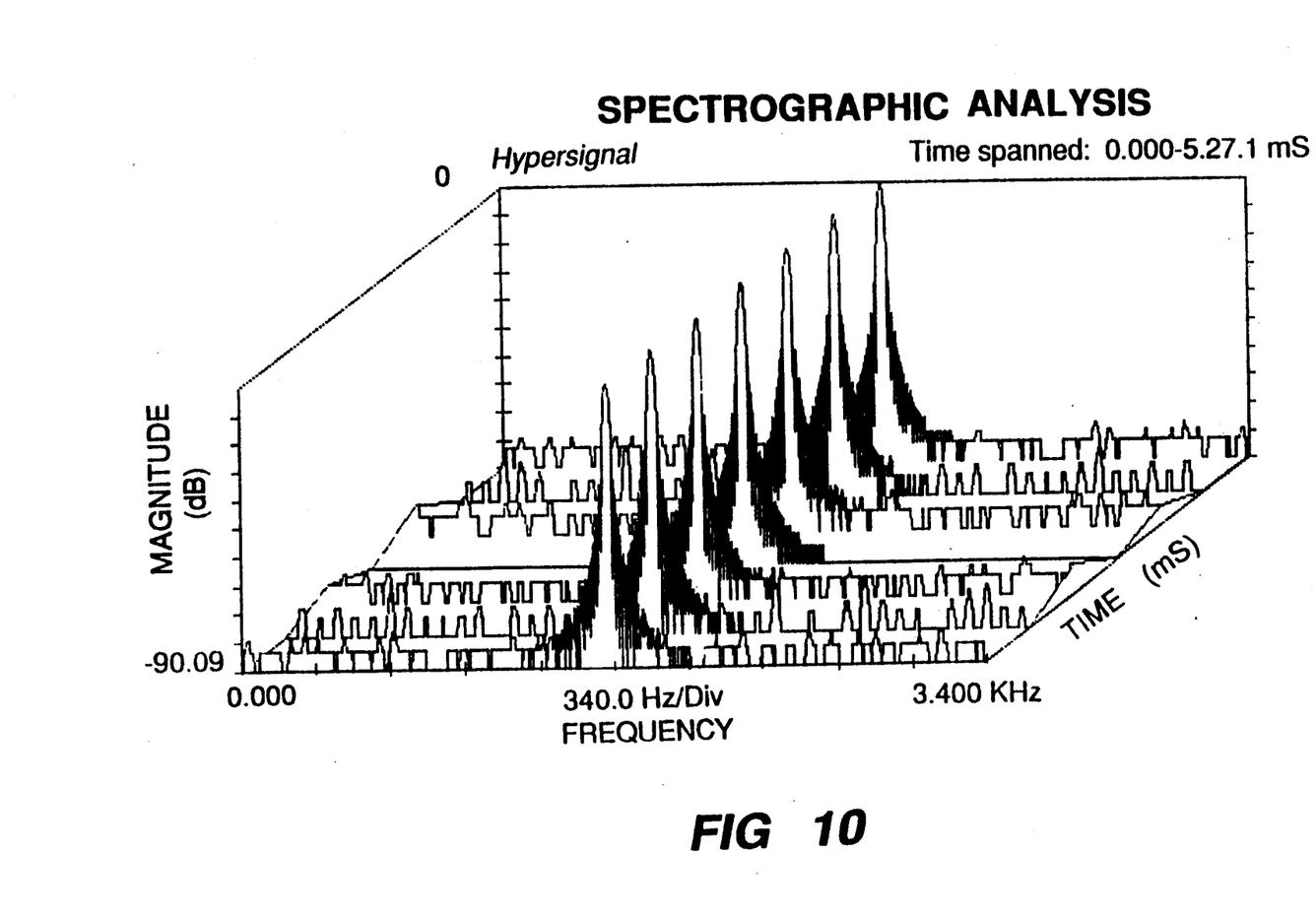
FIGS. 10 and 11 are graphs showing the input and the output respectively of a time domain analysis.
Figure 11:
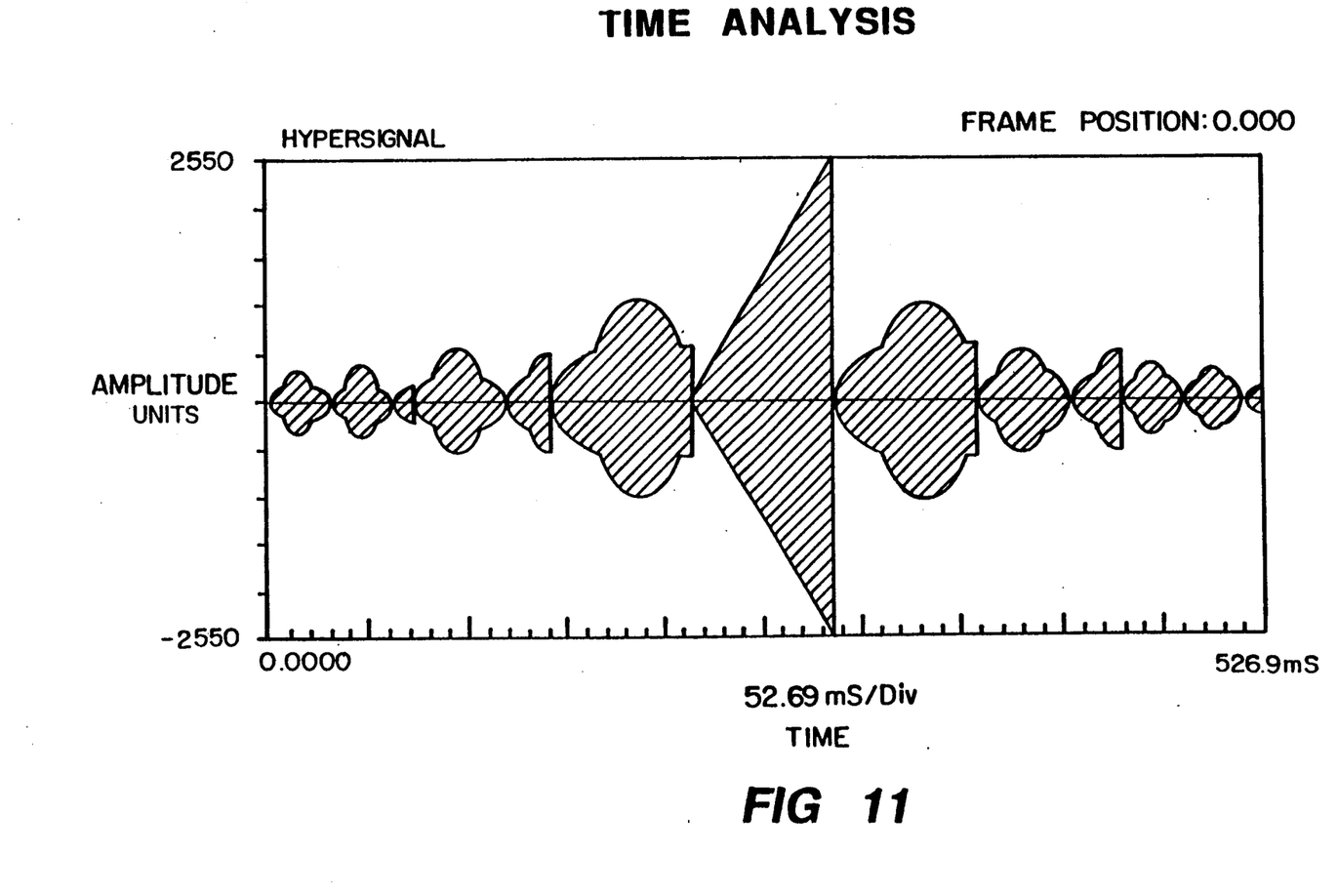

FIGS. 10 and 11 give a good understanding of the bandwidth. FIG. 10 shows a sequence of tone bursts (the length of each tone burst is 75.15 ms). The frequency of each consecutive tone burst is increased by 10 Hz. The frequency of the fourth tone burst is exactly 1700 Hz. The resonance frequency of the resonator is 1700 Hz. FIG. 11 shows the output signal "y". It is seen that the fourth input signal tone burst yields the largest amplitude on the output signal "y". A threshold detector placed between the largest amplitude of the fourth tone burst and the largest amplitude of the third and fifth tone burst thus produces a single tone detector for 1700 Hz with a bandwidth of 20 Hz.

We claim:

1. A distributed arithmetic digital signal processing apparatus for detecting a frequency component $F_r$ in a pulse coded digital input signal expressed in the fractional two's complement numeric representation, comprising:
storage means holding only three stored values which are respectively $A_0/4$, $B_1/4 = 2\{\cos(2\pi F_r/F_s)\}/4$, and $(A_0+B_1)/4$; where $A_0$ is a real number and $F_s$ is a sampling frequency; and having only two address terminals providing only two address bits and a data output terminal for producing a content signal in repsonse to the state of said two address bits;
first shift register means for receiving said input signal and sending each sample of said input signal to one of said address terminals;
second shift register means connected to the other of said address terminals for shifting its input by one sample and sending its output to said other of the address terminals;
subtracting means connected to said data output terminal for subtracting $\frac{1}{4}$ from said content signal;
an accumulator stage connected to said subtracting means for applying back its output to said second shift register means as the input of said second shift register means;
third shift register means connected to said second shift register means for shifting the output of said second shift register means by one sample and sending its output to said subtracting means; and
maximum register means connected to said accumulator stage to register a maximum value of the output of said accumulator stage in every sampling session containing a predetermined number of samples and to generate a detector output signal indicative of said maximum value which in turn is indicative of said frequency component $F_r$.

2. The distributed arithmetic digital signal processing apparatus, according to claim 1, wherein said accumulator stage comprises summing means for receiving said content signal from said subtracting means which has been subtracted by $\frac{1}{4}$, accumulator means connected to said summing means, and $2^{-1}$ shifting connections provided between said accumulator means and said summing means.

3. The distributed arithmetic digital signal processing apparatus, according to claim 2, further comprising a microprocessor connected to said storage means and said stored values of said storage means are variable by a microprocessor.

4. The distributed arithmetic digital signal processing apparatus, according to claim 3, further comprising comparison means connected to said accumulator stage and said maximum register means for comparing the accumulator output of each sample with the maximum value registered for previous samples in the same sampling session to update the content of said maximum register.

5. The distributed arithmetic digital apparatus, according to claim 4, wherein said digital signal is the tone signal used in telephony containing said frequency component $F_r$ within the audible frequency range.

6. The distributed arithmetic digital apparatus, according to claim 1, further comprising a reset means for repeatedly resetting the operation of said apparatus for each of successive sampling sessions, each sampling session containing a number of samples.

7. The distributed arithmetic digital apparatus, according to claim 6, wherein the number of said samples in each successive sampling sessions is adjustable.

* * * * *